(12) United States Patent
Roberts et al.

(10) Patent No.: US 6,869,869 B2
(45) Date of Patent: Mar. 22, 2005

(54) ALIGNMENT AND ORIENTATION FEATURES FOR A SEMICONDUCTOR PACKAGE

(75) Inventors: Stuart L. Roberts, Boise, ID (US); William J. Reeder, Boise, ID (US); Leonard E. Mess, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/439,369

(22) Filed: May 16, 2003

(65) Prior Publication Data

US 2003/0205795 A1 Nov. 6, 2003

Related U.S. Application Data

(62) Division of application No. 09/489,998, filed on Jan. 21, 2000, now Pat. No. 6,577,019.

(51) Int. Cl.⁷ .............................................. H01L 21/44
(52) U.S. Cl. ....................................... 438/612; 257/797
(58) Field of Search ........................... 257/797; 438/612

(56) References Cited

U.S. PATENT DOCUMENTS

| | | | | |
|---|---|---|---|---|
| 4,441,205 A | * | 4/1984 | Berkin et al. ................ | 382/151 |
| 5,082,165 A | | 1/1992 | Ishizuka | |
| 5,175,397 A | * | 12/1992 | Lindberg .................... | 174/52.4 |
| 5,322,207 A | | 6/1994 | Fogal et al. | |
| 5,350,106 A | | 9/1994 | Fogal | |
| 5,643,835 A | | 7/1997 | Chia | |
| 5,862,974 A | | 1/1999 | Sasano | |
| 5,870,517 A | | 2/1999 | Wyland | |
| 5,874,773 A | | 2/1999 | Terada | |
| 5,943,557 A | | 8/1999 | Moden | |
| 6,072,230 A | | 6/2000 | Carter, Jr. | |
| 6,130,115 A | | 10/2000 | Okumura | |

FOREIGN PATENT DOCUMENTS

JP          404277673 A     10/1992

* cited by examiner

Primary Examiner—David Nelms
Assistant Examiner—Thao P. Le
(74) Attorney, Agent, or Firm—Knobbe, Martens, Olson & Bear, LLP

(57) ABSTRACT

A semiconductor device formed by an automated wire bonding system. The semiconductor device comprises a lead frame having a plurality of lead fingers and a die paddle, and a semiconductor die mounted to the die paddle. The die paddle comprises a plurality of eyepoint features that extend from the die. The die comprises a first plurality of bonding pads and the lead fingers comprise a second plurality of bonding pads. The first and second bonding pads are interconnected by a plurality of connecting wires which are installed by the automated wire bonding system. The wire bonding system obtains an image of the lead frame and identifies the eyepoint features of the die paddle within the image so as to more accurately determine the positions of the second wire bonding pads of the lead frame with respect to the wire bonding system.

8 Claims, 6 Drawing Sheets

ALIGNMENT AND ORIENTATION FEATURES FOR A SEMICONDUCTOR PACKAGE

RELATED APPLICATIONS

This application is a divisional of U.S. patent application Ser. No. 09/489,998, filed Jan. 21, 2000 now U.S. Pat. No. 6,577,019, which is hereby incorporated in its entirety by reference herein.

BACKGROUND OF THE INVENTION

1. Field of the Invention

The present invention relates to semiconductor devices and, in particular, relates to a semiconductor device comprising a semiconductor die having a first plurality of bonding pads, and a lead frame having a second plurality of bonding pads, wherein the first bonding pads are connected to the second bonding pads by an automated wire bonding system.

2. Description of the Related Art

Advances in semiconductor processing methods continually provide modular semiconductor devices with increased circuit density and, thus, increased functionality. As a result, such devices are formed with reduced packaging sizes having increased numbers of conducting paths extending therefrom. Consequently, the problems associated with providing electrical connection to such devices are becoming increasingly apparent as will now be described in greater detail.

The typical semiconductor device comprises an extremely small semiconductor die encapsulated within a protective packaging material. In particular, the semiconductor die comprises electronic circuitry formed in a high density configuration. Such semiconductor dice include a plurality of circuit elements, such as transistors, diodes, resistors and capacitors, having sub-micron level dimensions. Furthermore, the circuit elements are electrically interconnected within the die in a preferred manner so as to provide the semiconductor die with a desired set of performance characteristics.

The typical semiconductor die is usually provided with a first plurality of wire bonding surfaces, otherwise referred to hereinbelow as bonding pads. In particular, the bonding pads are adapted to bond with first ends of a plurality of interconnecting conducting wires so that the first ends of the conducting wires are mechanically and electrically coupled to the first bonding pads. Additionally, the first bonding pads are arranged in a high density configuration on a surface of the die such that the pads are electrically coupled to specific circuit nodes within the die.

The typical semiconductor device further comprises a lead frame that provides the device with exposed leads that extend outside of the packaging material and that electrically couple with the circuit nodes of the encapsulated die. In particular, the lead frame usually includes a die mounting platform, otherwise known as a die paddle, which is adapted to fixedly support the die with respect to the lead frame. The lead frame of the typical semiconductor device further comprises a plurality of lead fingers which are disposed in a generally radial pattern around the die paddle so that the die mounted on the die paddle and the lead fingers are initially disposed in a generally common plane. Moreover, the lead fingers outwardly extend from first ends positioned at the interior of the packaging material adjacent the die paddle to second ends positioned at the exterior of the packaging material. Furthermore, a second plurality of bonding pads akin to the first bonding pads are usually located at the first ends of the lead fingers. Moreover, as will be described in greater detail below, the conducting wires are attached between the first and second bonding pads in a wire bonding process so as to electrically couple the first pads with the second pads.

Following the wire bonding process, the die is encapsulated within the packaging material which is typically formed with a rectangular shape. Furthermore, in addition to encapsulating the die, the packaging material also encapsulates the die paddle and the first ends of the lead fingers of the lead frame. However, the second ends of the lead fingers are positioned outside of the packaging material so that they are the exposed leads of the semiconductor device. Moreover, the exposed leads are typically bent so that each lead is positioned adjacent an exterior surface of the packaging material in a flush manner and so that the leads do not contact each other. Thus, since the conducting wires electrically couple the first and second bonding pads, the exposed leads are electrically coupled with the circuit nodes of the die.

Usually, each of the interconnecting conducting wires extending between the lead frame and the die are sequentially installed by an automated wire bonding system prior to encapsulation of the die. In particular, the typical wire bonding system is adapted to position the first end of a particular conducting wires adjacent the corresponding first bonding pad of the die in a flush manner. The wire bonding system is also adapted to bond the first end of the conducting wire to the corresponding first bonding pad so that the first end is fixedly attached thereto. Furthermore, the wire bonding system is adapted to position the second end of the conducting wires adjacent the corresponding second bonding pad of the lead frame in a flush manner and subsequently bond the second end thereto.

To determine the relative positions of the first and second bonding pads with respect to the wire bonding system, the typical automated wire bonding system utilizes an imaging device to obtain a digitized image of the lead frame having the die mounted thereto. In particular, the image is scanned by a processor which attempts to identify particular features of the die and lead frame. More particularly, the relative positions of the first bonding pads are determined by locating the die within the image. Furthermore, the positions of the second bonding pads of the lead frame are usually determined by identifying and locating the first end of at least one of the lead fingers of the lead frame within the image as disclosed in U.S. Pat. No. 5,350,106 to Fogal. Moreover, since the first ends of the lead fingers are fixedly positioned with respect to each other in a predefined manner, the positions of the remaining second bonding pads are determined by referencing the position of the first end of the at least one identified lead finger.

However, with the advent of increased circuit density, lead frames are required to accommodate greater numbers of lead fingers in higher density configurations. In particular, the increased density of the lead fingers requires their first ends and, thus, the second bonding pads formed thereon to be formed with reduced dimensions. Consequently, since it is generally not practical to provide relatively small bonding pads with a distinctive shape, the first ends of the lead fingers are often formed with nearly identical geometries. Thus, it is becoming increasingly difficult to correctly distinguish the first ends of the lead fingers of the lead frame from each other. As a result, automated wire bonding systems are increasingly having difficulties in identifying the lead fingers to connect the appropriate wirebonds.

For example, while attempting to identify the first end of the first lead finger of a high density lead frame, it is possible that the typical wire bonding system could mistakenly identify the first end of a neighboring second lead finger having a geometry similar to that of the first lead finger. Thus, the position of the first end of the first lead finger will be incorrectly determined. Furthermore, since the wire bonding system uses the position of the first end of the first lead finger to determine the positions of the first ends of the remaining lead fingers, the wire bonding system will incorrectly determine the positions of the first ends of the remaining lead fingers. Consequently, since the wire bonding system is unable to properly connect the first and second bonding pads together, the semiconductor device will not provide the desired electrical characteristics.

Another shortcoming of prior art wire bonding systems is that they utilize lead frames that provide an insufficient indication of the orientation of the lead frame. In particular, it is possible for the lead frame to be mistakenly oriented within the wire bonding system in a rotated manner such that the lead frame is rotated by 180 degrees about an axis that extends perpendicularly from the plane of the lead frame. Since the lead frame is often formed in a symmetrical manner with respect to such a rotation, this problem may be overlooked by an observer responsible for visually inspecting the orientation of the lead frame. Moreover, since the typical lead frame comprises a symmetrical shape with respect to the 180 degree rotation, the wire bonding system may not identify the incorrect orientation of the lead frame. Consequently, since the first bonding pads are often disposed on the die in an asymmetrical manner and since the interconnecting wires are often installed with an asymmetrical configuration, it is likely that considerable time and materials will be wasted by the wire bonding system in a futile attempt to electrically couple the die with the lead frame. Thus, since semiconductor devices formed in this manner lack the appropriate conducting paths that extend from the exposed leads, this problem results in increased failure rates, reduced production yields and increased production costs.

From the foregoing, therefore, it will be appreciated that there is a need for an improved automated wire bonding system. In particular, there is a need for the improved system to more reliably provide a high density semiconductor device with correctly extending conducting paths between exposed leads of a lead frame of the device to appropriate circuit nodes within an encapsulated semiconductor die of the device. Furthermore, there is a need for the system to utilize a lead frame that allows a user to more easily identify whether the lead frame is correctly oriented within the wire bonding system.

SUMMARY OF THE INVENTION

The aforementioned needs are satisfied by the present invention which, according to one aspect, comprises a semiconductor device that includes a semiconductor device having a first plurality of bonding pads disposed along a surface of the die. The semiconductor device further comprises a lead frame that includes a die paddle for supporting the semiconductor die, and a plurality of lead fingers having a second plurality of bonding pads formed thereon. The die paddle comprises a mounting region and at least one eyepoint feature that extends from the mounting region. The semiconductor die is mounted adjacent the mounting region of the die paddle so that the die is secured to the die paddle and so that the die does not extend over the at least one eyepoint feature. The semiconductor device further comprises a plurality of connecting wires that extend between the first and second bonding pads so as to provide electrically conducting paths therebetween.

In another aspect of the present invention, a method of electrically connecting a first plurality of bonding pads of a semiconductor die to a second plurality of bonding pads located on lead fingers of a lead frame of a semiconductor device comprises obtaining an image of the lead frame. The method further comprises identifying the location of an eyepoint feature formed on a die paddle of the lead frame adapted to receive the semiconductor die. The method further comprises determining the relative location of the second plurality of bonding pads from the identified location of the eyepoint feature located on the die paddle of the lead frame.

In a further aspect of the present invention, a wire bonding system is provided for wire bonding between a first plurality of bonding pads located on a surface of a die positioned on a die paddle of a lead frame and a second plurality of bonding pads located on lead fingers of a lead frame wherein the lead frame further comprises at least one eyepoint feature located on the die paddle. The system comprises an imaging device that obtains an image of the lead frame and a processor that receives the obtained image and evaluates the received image to determine the location of the at least one eyepoint feature located on the die paddle of the lead frame. The processor further determines the relative location of the second plurality of bonding pads from the determined location of the at least one eyepoint features. The system further comprises a wire bonding device that receives signals from the processor that attaches wire bonds between the first plurality of bonding pads and the second plurality of bonding pads as located by the processor from the image obtained by the imaging device.

In yet another aspect of the present invention, a lead frame comprises a die paddle having a plurality of outer lateral edges wherein the die paddle is adapted to receive a semiconductor die having a first plurality of bonding locations. The lead frame further comprises a plurality of lead fingers defining second bonding locations to which wire bonds are to be bonded in a desired pattern between the first plurality of bonding locations and a second plurality of bonding locations. The lead frame further comprises at least one eyepoint feature formed on a lateral edge of the die paddle so as to be visible when the die is mounted on the die paddle. The at least one eyepoint feature is fixedly positioned with respect to the second bonding locations so that the at least one eyepoint provides a point of reference from which the relative location of each of the second bonding locations with respect to an origin can be determined.

In another aspect of the present invention, a lead frame comprises a die paddle having a plurality of outer lateral edges wherein the die paddle is adapted to receive a semiconductor die. The lead frame further comprises a plurality of lead fingers and an orientation indicator formed on a lateral edge of the die paddle so as to be visible when the die is mounted on the die paddle. The orientation indicator extends in a direction corresponding to the orientation of the lead frame and enables a human observer to visually determine the orientation of the lead frame by observing the direction of extension of the orientation indicator.

From the foregoing, it should be apparent that the eyepoint features extending from the die paddle of the lead frame of the preferred embodiments of the present invention enable the second bonding pads of the lead frame to be determined with greater accuracy. This enables the semiconductor die to be wire-bonded to the lead frame with greater reliability. These and other objects and advantages of the present invention will become more apparent from the following description taken in conjunction with the accompanying drawings.

DETAILED DESCRIPTION OF THE PREFERRED EMBODIMENT

Figure 1:
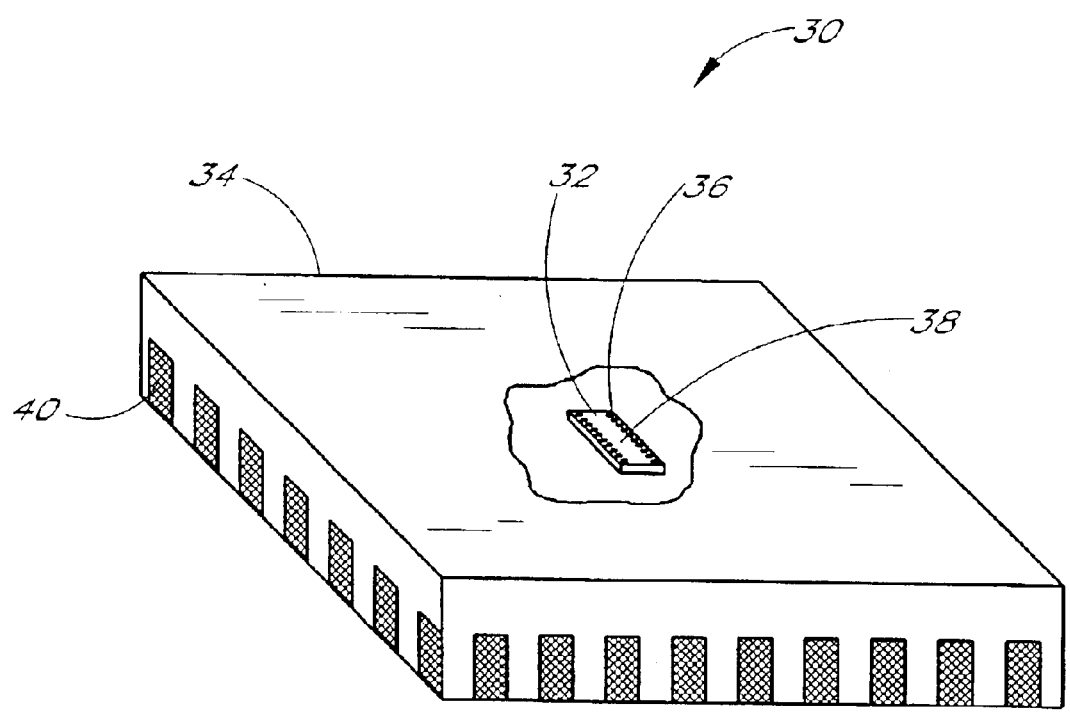
FIG. 1 is an perspective view of a semiconductor device in accordance with one aspect of the present invention.

Reference will now be made to the drawings wherein like numerals refer to like parts throughout. In particular, FIG. 1 illustrates a semiconductor device 30 in accordance with one aspect of the present invention. The semiconductor device 30 comprises a known semiconductor die 32 housed within a known packaging material 34. The semiconductor die 32 comprises a preferred configuration of circuit elements that are interconnected so as to provide an electrical integrated circuit of any of a number of possible configurations. The semiconductor die 32 further comprises a first plurality of bonding pads 36 disposed a first surface 38 of the die 32 that electrically couple with a plurality of circuit nodes of the electrical circuit of the die 32.

As shown in FIG. 1, the semiconductor device 30 further comprises a plurality of exposed leads 40 that extend into the packaging material 34 so as to provide conducting paths that extend from the leads 40 toward the encapsulated die 32. As will be described in greater detail below in connection with FIG. 2, the semiconductor device 30 further comprises a lead frame 42 that includes a plurality of lead fingers 44 extending from the exposed leads 40 to an interior region of the packaging material 34. Furthermore, as will be described in greater detail below in connection with FIGS. 3 through 6, the lead frame 42 is adapted so that an improved automated wire bonding system 110 can be utilized to more reliably wire bond the die 32 to the lead frame 42.

Figure 2:
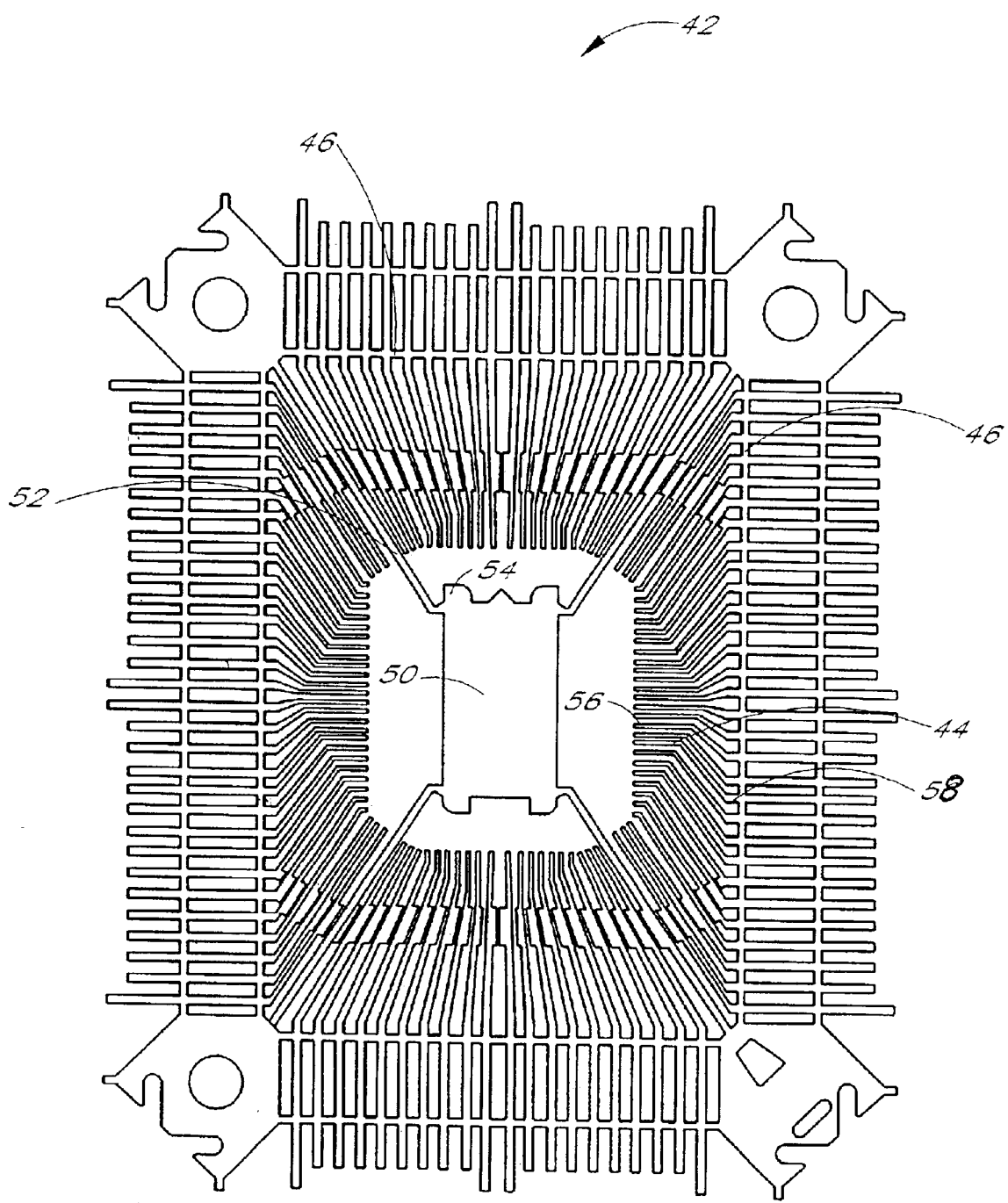
FIG. 2 is an overhead view of one embodiment of a lead frame of the semiconductor device of FIG. 1 illustrating a plurality of lead fingers and a die paddle of the lead frame.

Reference will now be made to FIG. 2 which illustrates the initially configured lead frame 42 of the semiconductor device 30 in accordance with one aspect of the invention. In particular, the lead frame 42 is initially formed with a generally planar shape of conducting material, such as copper, that is held together by supporting border elements 46 that are formed around the perimeter of the lead frame 42. Furthermore, the lead frame 42 comprises a generally planar die paddle 50 positioned at the center of the lead frame 42 and supported by the supporting border elements 46 by a plurality of die paddle support elements 52 that outwardly extend from the die paddle 50 to the supporting border elements 46. The purpose of the die paddle 50 is to support the semiconductor die 32 so that the die 32 is positioned substantially at the center of the lead fingers 44. Moreover, as will be described in greater detail below in connection with FIGS. 3 through 6, the die paddle 50 includes at least one distinctive feature 54, otherwise referred to as an eyepoint feature 54, that enables the wire bonding system 110 to form wire bonds with greater reliability.

As shown in FIG. 2, the lead frame further comprises the plurality of lead fingers 44. In particular, each lead finger 44 includes a first end 56 that is positioned adjacent to and separately from the die paddle 50. As will be described in greater detail below in connection with FIG. 4, the first end 56 of each lead finger is wire bonded to a corresponding first bonding pad 36 (FIG. 1) on the die 32 in a known manner so as to electrically couple the first ends of the lead fingers with the first bonding pads.

As shown in FIG. 2, each lead finger 44 outwardly extends from the first end 56 toward a second end 58. In particular, in the initial configuration of the lead frame 42, the second ends 58 of the lead fingers 44 are connected to the supporting border elements 46 so that the lead fingers 44 are fixedly positioned with respect to the die paddle 50 during fabrication of the semiconductor device 30 and so that the second ends 58 are distally positioned with respect to the die paddle 50. However, in a final configuration, the second ends 58 of the lead fingers 44 are located outside of the packaging material 34 and severed from the supporting border elements in a manner known in the art so that the lead fingers 44 are electrically isolated from each other. Furthermore, in one embodiment, the exposed second ends 58 of the lead fingers 44 are bent to become the exposed leads 44 of the semiconductor device 30 as shown in FIG. 1.

Figure 3:
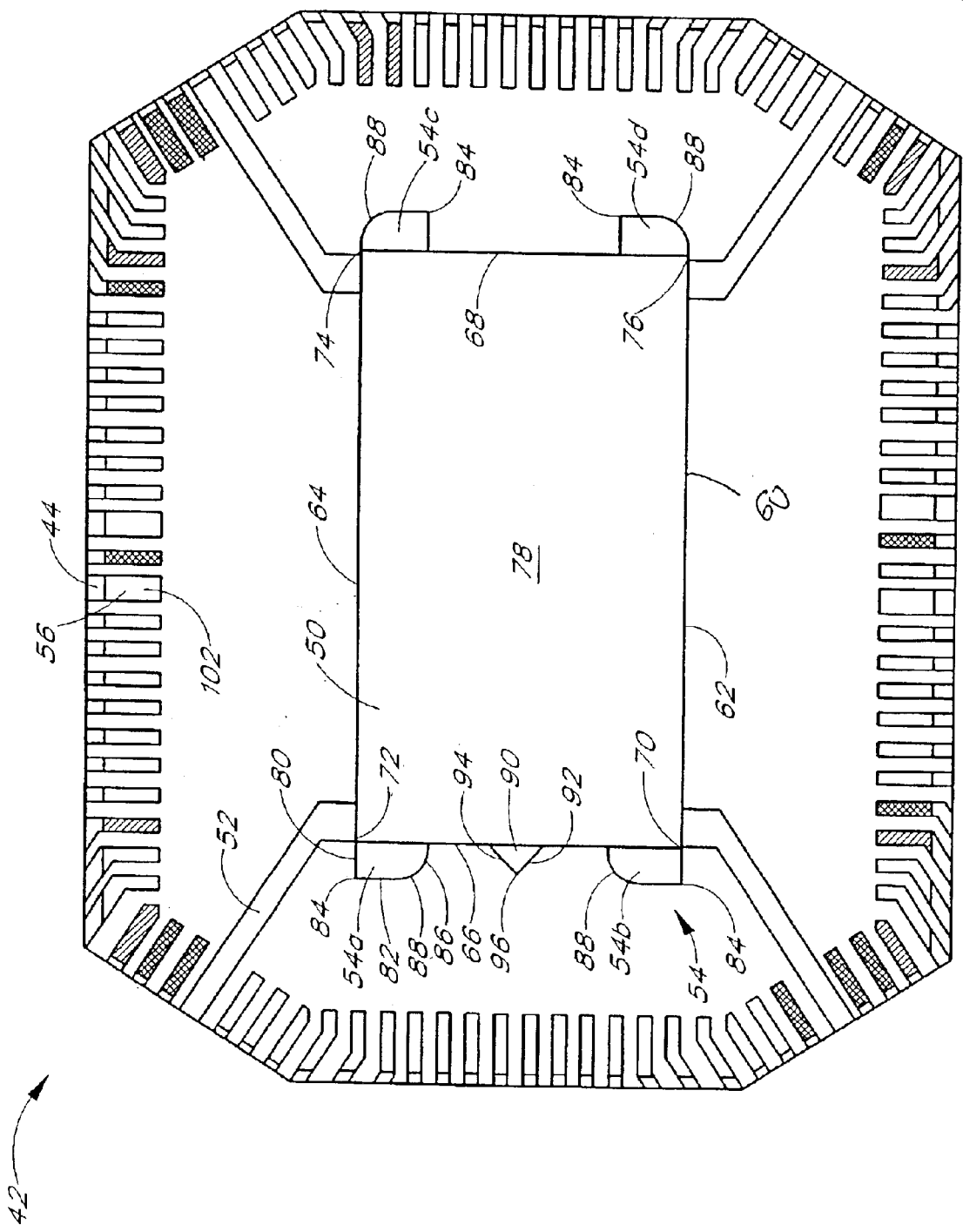
FIG. 3 is a magnified view of the lead frame of FIG. 2 that illustrates the die paddle and a plurality of wire bond pads of the lead fingers in greater detail.

Reference will now be made to FIG. 3 which illustrates one embodiment of the die paddle 50 of the lead frame 42 in greater detail. In particular, the die paddle 50 comprises a substantially rectangular die mounting region that includes first and second longitudinal side edges 62, 64, and first and second lateral side edges 66, 68 that join to form first, second, third, and fourth corners 70, 72, 74 and 76. More particularly, the die mounting region 60 provides a mounting surface 78 that is adapted to support the semiconductor die 32. The die paddle 50 further comprises the eyepoint features 54 that extends from the rectangular mounting region 60.

As shown in FIG. 3, in one embodiment, the eyepoint features 54 comprise first, second, third, and fourth eyepoint features 54a–54d that extend from the die mounting region 60 adjacent the corners 70, 72, 74 and 76 of the die paddle 50 respectively. The eyepoint features 54a and 54b respectively extend from the lateral edge 66 of the die mounting region 60 adjacent the corners 70, 72. Furthermore, the eyepoint features 54c and 54d respectively extend from the lateral edge 68 of the die mounting region 60 adjacent the corners 74 and 76.

As shown in FIG. 3, the eyepoint features 54 are formed with a relatively large distinctive shape. In particular, in one embodiment, each eyepoint feature 54 includes a first edge 80 that perpendicularly extends from the lateral edges 66, 68 of the die mounting region 60 of the die paddle 50. Furthermore, each eyepoint feature 54 includes a second edge 82 that initially extends from the first edge in a perpendicular manner so as to provide each eyepoint feature 54 with a relatively sharp point 84. Moreover, each eyepoint feature 54 includes a third edge 86 that initially extends from the lateral edges 66, 68 of the rectangular region 60 in a perpendicular manner toward the second edge 82 in a gradual manner so as to form a curved region 88. Additionally, the eyepoint feature 54 are formed with a width extending from the first edge 80 to the third edge 86 which is substantially larger than the width of the first ends 56 the lead fingers 44 of the lead frame 42. Thus, as will be described in greater detail below in connection with FIGS. 4 and 5, the advantageous shape of the eyepoint features 54 enables their locations to be reliably determined by the automated wire bonding system 110.

As shown in FIG. 3, the eyepoint features 54 as a group are preferably arranged in an asymmetrical manner such that the eyepoint features 54 are substantially separated from each other. In particular, the eyepoint features 54a and 54b extending from the lateral edge 66 of the die mounting region 60 are arranged so that their curved regions 88 are proximally positioned with respect to each other and so that their sharp points 84 are distally positioned with respect to each other. Furthermore, the eyepoint features 54c and 54d extending from the lateral edge 68 are arranged so that their sharp points 84 are proximally positioned with respect to each other and so that their curved regions 88 are distally positioned with respect to each other.

As shown in FIG. 3, in one embodiment, the die paddle 50 further comprises an eyepoint feature 90 that enables an observer to quickly determine the orientation of the lead frame 42. In particular, the eyepoint feature 90 outwardly extends from the center of the lateral edge 66 of the die paddle 50 and has a pointed shape so as to resemble an arrow. More particularly, the eyepoint feature 90 comprises a first edge 92 that diagonally extends from the lateral edge 66 of the mounting region 60. Furthermore, the eyepoint feature 90 comprises a second edge 94 that extends from the first edge 92 at a sharp point 96 toward the lateral edge 66 of the mounting region 60 in a diagonal manner. Thus, since the eyepoint feature 94 extends outwardly from the mounting region 60 of the die paddle 50, an observer's view of the eyepoint feature 90 is not obscured by the semiconductor die 32 mounted adjacent the mounting region 60 of the die paddle 50.

Thus, it will be appreciated that the eyepoint feature 90 allows an observer or an automated wire bonding system to quickly determine the orientation of the lead frame 42 within a wire bonding system. In particular, when the lead frame 42 is aligned in a preferred orientation in the wire bonding system, the eyepoint feature 90 extends from the lead frame 42 in a first direction. Thus, if the lead frame 42 is rotated about an axis that is perpendicular to the plane of the lead frame 42, eyepoint feature 90 will extend in a second direction which is different from the first direction.

For example, lead frames are sometimes improperly positioned within a wire bonding system such that the lead frame is rotated by 180 degrees from the preferred orientation. Since lead frames usually have a symmetrical shape, it can be difficult for an observer to detect this misalignment. However, by forming the die paddle 50 of the lead frame 42 with the asymmetrically extending eyepoint feature 90, the observer can readily detect the misalignment by observing the eyepoint feature 90 extending in a direction that is opposed to the preferred direction.

As shown in FIG. 3, the first ends 56 of the lead fingers 44 of the lead frame 42 are disposed adjacent the die paddle 50 in a generally circular pattern. Furthermore, as will be described in greater detail below in connection with FIG. 4, the first ends 56 have surfaces that provide the lead frame with a second plurality of bonding pads 102 for interconnecting the lead fingers 44 to the die 32.

Figure 4:
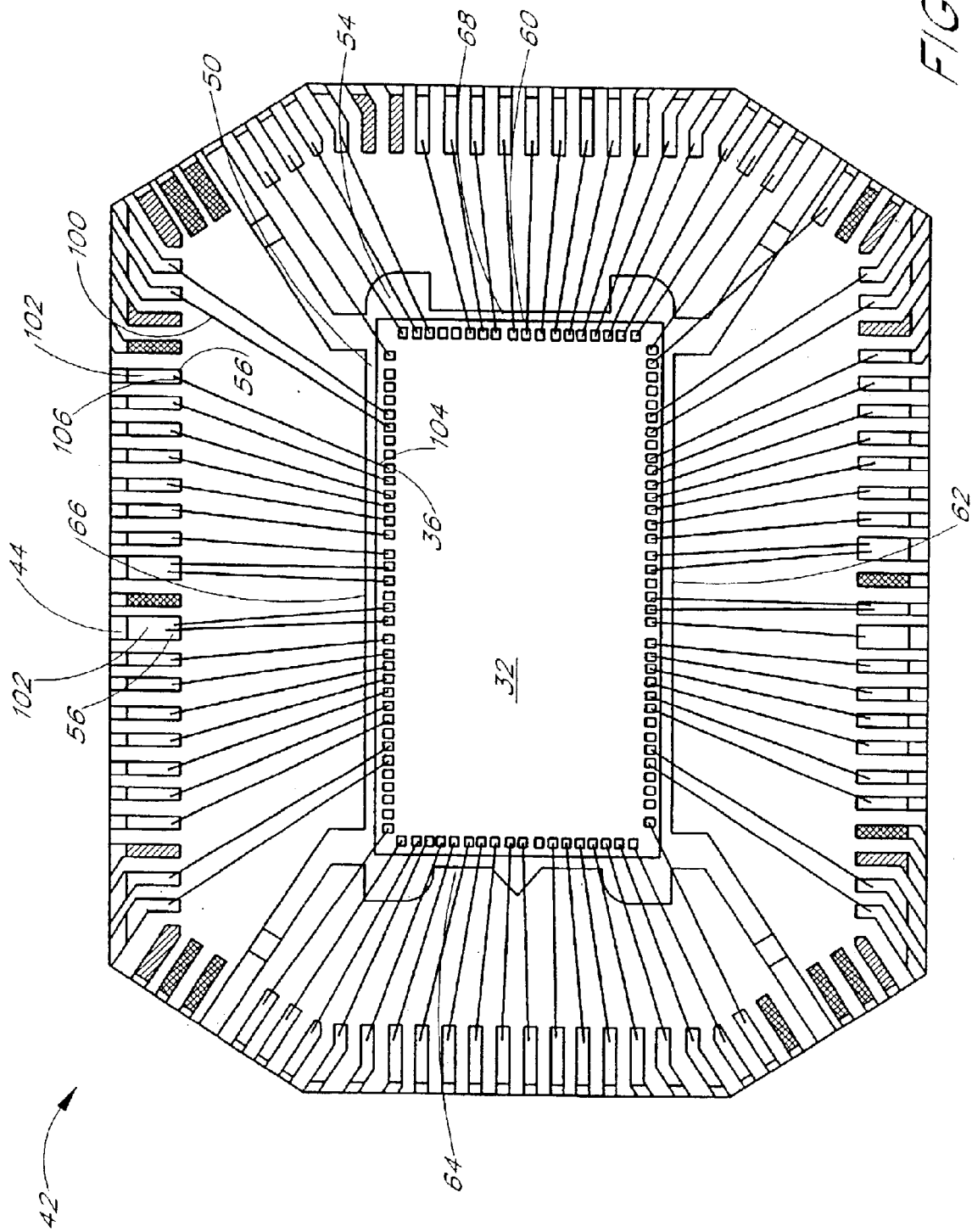
FIG. 4 is a magnified view of the lead frame of FIG. 2 that illustrates a semiconductor die mounted to the die paddle and a plurality of wire bonds formed between a plurality of wire bond pads of the semiconductor die and the wire bond pads of lead fingers.

Reference will now be made to FIG. 4 which illustrates the semiconductor die 32 mounted to the lead frame 42 and the lead frame 42 and semiconductor die 32 electrically interconnected in a wire-bonded configuration. In particular, the die 32 is fixedly mounted adjacent the mounting surface 78 of the mounting region 60 of the die paddle 50 of the lead frame 42 in a manner known in the art such that the die 32 is positioned between the edges 62, 64, 66 and 68 of the mounting region 60. Thus, the eyepoint features 54 and 90 of the die paddle 50 extend beyond the die 32 so that an unobstructed view of the eyepoint features 54 and 90 is provided. Consequently, as will be described in greater detail below in connection with FIGS. 5 and 6, the wire bonding system 110 is able to obtain an image of the lead frame 42 that includes the eyepoint features 54, 90.

As shown in FIG. 4, in the wire-bonded configuration, a plurality of wire bonds 100, or connecting wires, extend between the lead fingers 44 of the lead frame 48 and the semiconductor die 32 in a generally radial manner so as to electrically couple the lead fingers 44 to the circuit nodes of the die 32. In particular, the connecting wires 100 extend from the first plurality of bonding pads 36 disposed on the first surface 34 of the die 32 to the second plurality of bonding pads 102 disposed on the first ends 56 of the lead fingers 44. Specifically, a first end 104 of each wire 100 is bonded to the corresponding first bonding pad 36 of the die 32. Furthermore, a second end 106 of each wire 100 is bonded to the second bonding pad 102 on the first end 56 of the corresponding lead finger 44.

Figure 5:
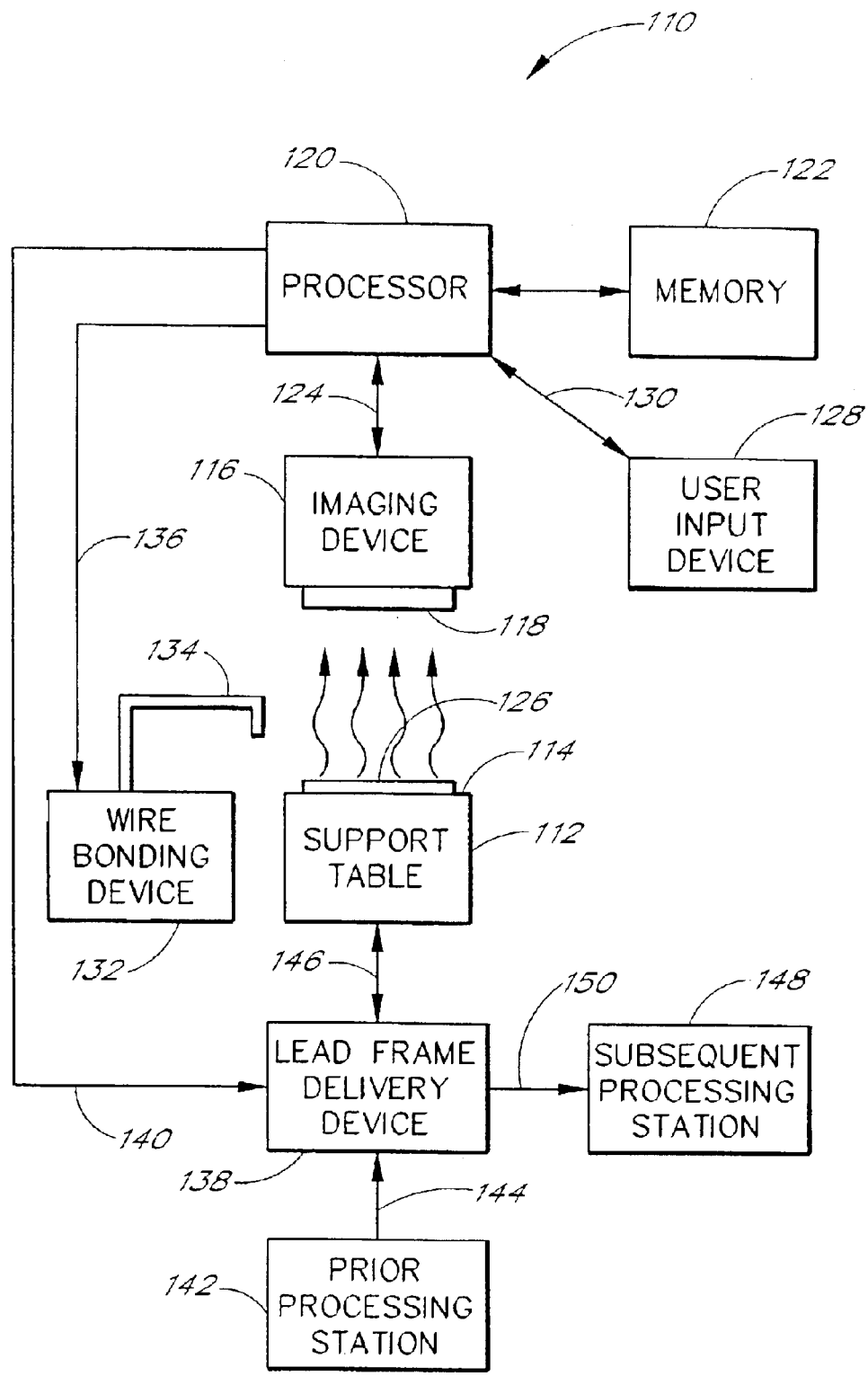
FIG. 5 is a schematic diagram of a wire bonding system in accordance with one aspect of the present invention which is adapted to provide the wire bonded lead frame of FIG. 4.

Reference will now be made to FIG. 5 which schematically illustrates one embodiment of the automated wire bonding system 110 in accordance with one aspect of the present invention. The wire bonding system 110 is comprised of any of a number of currently available wire bonding systems such as Model 2920 Turbo 8028 wire bonding system available from Kulicke & Soffa of Willow Grove, Pa. that has been configured to perform the feature recognition as described in greater detail below. In particular the wire bonding system 110 is adapted to position the connecting wires 100 of FIG. 4 so that they extend between the first and second bonding pads 36 and 102, and respectively bond the ends 104, 106 of the connecting wires 100 to the first and second bonding pads 36 and 102. Furthermore, to increase the likelihood that the connecting wires 100 are bonded to the desired locations, the wire bonding system 110 utilizes the eyepoint features 54, 90 of the die paddle 50 as will be described in greater detail below.

As schematically shown in FIG. 5, the wire bonding system 110 generally comprises a lead frame support table 112 having a supporting surface 114, and an imaging device 116 having an input face for collecting light. In particular, the imaging device 116 is positioned adjacent the table 112 so that a portion of light reflecting off of the supporting surface 114 is directed toward the input face 118 of the imaging device 116. Furthermore, the imaging device 116 receives such light through the input face and focuses the light so as to form an image. In one embodiment, the imaging device 116 comprises a digital camera that provides a digital image.

As shown in FIG. 5, the lead frame 42 is positioned adjacent the supporting surface 114 of the support table 112. In particular, the lead frame 42 is positioned in a substantially fixed manner so that a portion of light reflecting off of the first surface 38 of the semiconductor die 32 enters the input face 118 of the imaging device 116. Furthermore, a portion of light reflecting off of the eyepoint features 54, 90 of the die paddle 50 and the lead fingers 44 enters the input face 118 of the imaging device. Thus, the image provided by the imaging device 116 is similar to that which is illustrated in FIG. 4.

As shown in FIG. 5, the wire bonding system 110 further comprises a processor 120 having one or more associated memories 122 that controls the wire bonding system 110. In particular, the processor 120 communicates with the imaging device 116 via a communication path 124 such that the processor 120 is able to direct the imaging device 116 to obtain the digital image of the lead frame 42. Furthermore, the processor 120 receives the digital image from the imaging device 116 and stores the image in the memory 122 in a known manner. As will be described in greater detail below in connection with FIG. 6, the processor 120 utilizes the image stored in the memory 122 to determine the positions of the first and second bonding pads 36 and 102 with respect to an origin 126 of the wire bonding system 110 that is fixedly positioned with respect to the support table 112.

As shown in FIG. 5, the wire bonding system 110 can further comprise a user input device 128 that communicates with the processor 120 via a second communication path 130 so that a user can enter data and commands to the processor 120. In particular, in one embodiment, the positions of the second bonding pads 102 of the lead frame 42 with respect to the eyepoint features 54, 90 of the lead frame 42 are communicated to the processor 120 via the user input device 128 and stored in the memory 122. Furthermore, in one embodiment, the positions of the first bonding pads 36 of the semiconductor die 32 with respect to the center of the semiconductor die 32 are communicated to the processor 120 via the user input device 128 and stored in the memory 122.

As shown in FIG. 5, the wire bonding system 110 can further comprise a wire bonding device 132 which has a movable arm 134 that sequentially installs the interconnecting wires 100 of FIG. 4. In particular, the wire bonding device 132 communicates with the processor 120 via a third communication path 136. Furthermore, under the direction of the processor 120, the arm 134 of the wire bonding device 132 positions the first end 104 of each conducting wire 100 adjacent the corresponding first bonding pad 36 of the semiconductor die 32 in a flush manner and mounts the first end 104 of the connecting wire 100 to the first bonding pad 36 in a well known manner. Furthermore, the arm 134 of the wire bonding device 132 extends the connecting wire 110 so that the second end 106 of the connecting wire 100 is positioned adjacent the corresponding second bonding pad 102 of the lead frame 42 in a flush manner. Moreover, the wire bonding device 132 bonds the second end 106 of the connecting wire 100 to the second bonding pad 102 in a well known manner.

Although the wire bonding device 132 of the wire bonding system 110 described above begins at the bonding pads 36 of the semiconductor die 32 and ends at the bonding pads 102 of the lead frame 42, it should be apparent to a person skilled in the art that the wire bonding device 132 could operate in an alternative manner. Furthermore, the terms first and second are provided for illustrative purposes only and are not meant to imply a particular order in which the ends 104, 106 of the connecting wires 100 are installed by the wire bonding system 110. For example, in another embodiment, the wire bonding device 132 could be adapted to connect the second end 106 of each wire 100 to the corresponding second bonding pad 102 of the lead frame 42 before connecting the first end 104 of the same wire 100 to the corresponding first bonding pad 36 of the semiconductor die 32.

As shown in FIG. 5, in one embodiment, the wire bonding system 110 can further comprise a lead frame delivery device 138. In particular, the lead frame delivery device 138 communicates with the processor 120 via a fourth communication path 140. Furthermore, under the direction of the processor 120, the delivery device 138 receives the lead frame 42 having the semiconductor die 32 mounted thereto in a non-wire bonded configuration from a prior processing station 142 along a first path 144 and delivers the lead frame to the support table 112 along a second path 146. Moreover, the lead frame delivery device 138 delivers the lead frame 42 in the wire-bonded configuration to a subsequent processing station 148 along a third path 150.

Figure 6:
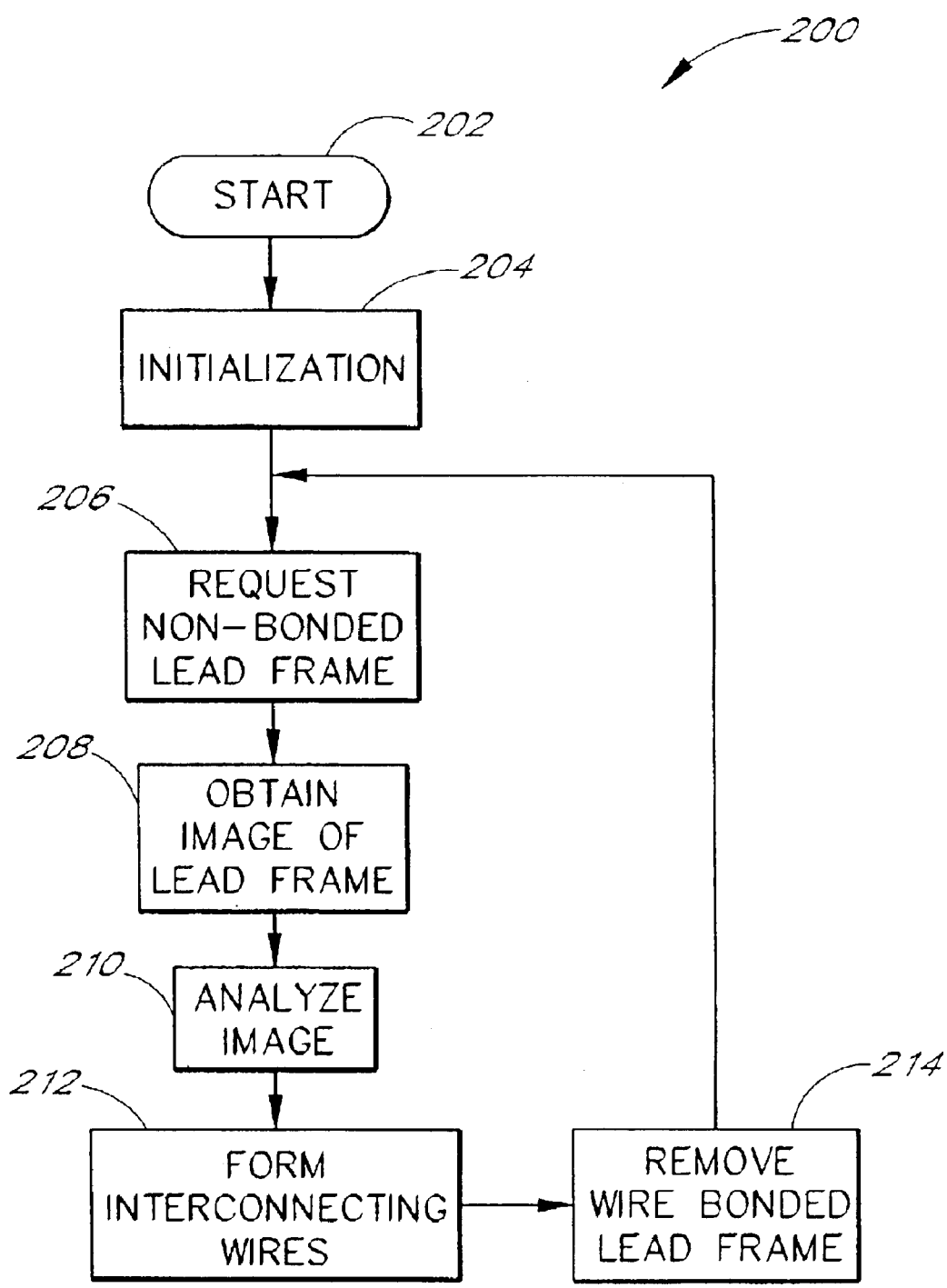
FIG. 6 is a flow chart that illustrates the operation of a controller of the wire bonding system of FIG. 5.

Reference will now be made to FIG. 6 which is a flow chart 200 that illustrates the operation of the wire bonding system 110 of FIG. 5. The flowchart of FIG. 6 is, of course, simply illustrative of the basic operation of the wire bonding system 110 as the wire bonding system 110 determines the location of the second bonding locations using the eyepoint features described above. It should be appreciated that the exact programming steps to implement the process of the present invention will vary depending upon the implementation of the invention.

In particular, from a start state 200, the processor 120 enters an initialization state 202, wherein the processor 120 receives wire bonding data from a user. More particularly, the positions of the first bonding pads 36 with respect to the die 32, the configuration of the eyepoint features 54, 90 of the die paddle 50 of the lead frame 42, and the positions of the second bonding pads 102 with respect to the eyepoint features 54, 90 are communicated to the processor 120 via the user input device 128 and stored in the memory 122. Furthermore, the orientation of the imaging device 116 with respect to the support table 112 is communicated to the processor 120 so that the processor 120 can determine the position of the origin 126 of the wire bonding system 110 within the image.

As shown in FIG. 6, the processor 120 then, in a request state 204, requests delivery of the non-wire bonded lead frame 42 from the lead frame delivery device 138. As a result, the delivery device 138 positions the non-wire bonded lead frame 42 on the support table 112 in a secure manner.

As shown in FIG. 6, the processor 120, in a request state 206, then requests the imaging device 116 to provide the digitized image of the lead frame 42 and semiconductor die 32 to the processor 120. In particular, the imaging device 116 receives light coming from the lead frame 42 and semiconductor die 32 and focuses the light to form a real image. The real image is then processed by the imaging device 116 in a well known manner so as to provide the digitized image. The processor 120 then receives the digitized image from the imaging device 116 and stores the digitized image in the memory 122.

As shown in FIG. 6, the processor 120, in a processing state 208, then analyzes the digitized image stored in the memory 122 so as to determine the positions of the first bonding pads 36 of the die 32 with respect to the origin 126 of the wire bonding system 110. In particular, the processor 120 utilizes a known pattern recognition algorithm adapted to determine the location and orientation of the die 32 with respect to the origin 126 of the wire bonding system 110.

Furthermore, using the location and orientation of the die 32 along with the positions of the first bonding pads 36 with respect to the die 32, the processor 120 computes a first plurality of positions that are the positions of the first bonding pads 36 with respect to the origin 126 of the wire bonding system 110 and stores the computed first plurality of positions in the memory 122.

The processor 120, in the processing state 208, then further analyzes the digitized image stored in the memory 122 so as to determine the positions of the second bonding pads 102 of the lead frame 42 with respect to the origin 126 of the wire bonding system 110. In particular, using the configuration data of the eyepoint features 54, 90 of the die paddle 50 stored in the memory 122 during the initialization state 202, the processor 120 scans the image stored in the memory 122 so as to identify the eyepoint features 54, 90 within the image. The processor 120 then determines the average of the positions of the eyepoint features 54, 90 with respect to the origin 126 of the wire bonding system 110. The processor 120 also determines the orientation of the eyepoint features 54, 90 with respect to the orientation of the image. Preferably, the processor 120 utilizes a known edge detection algorithm that identifies the edges of the eyepoint features 54, 90 within the digitized image stored in the memory. Furthermore, using the average position and the orientation of the eyepoint features 54, 90 and the positions of the second bonding pads 102 of the lead frame 42 with respect to the eyepoint features 54, 90 entered during the initialization stage 202, the processor 120 computes a second plurality of positions that are the positions of the second bonding pads 102 of the lead frame 42 with respect to the origin 126 and stores the second plurality of positions in the memory 122.

For example, in one embodiment, the processor 120 in the processing state 208 attempts to identify the two eyepoint features 54a and 54c of FIG. 3. As mentioned previously, each of the eyepoint features 54 includes the sharp point 84. While scanning the image, the processor 120 identifies the two eyepoint features 54a and 54c by identifying the edges 80, 82, and 86 and the sharp point 84. The processor 120 then equates the positions of the eyepoint features with the positions of the sharp points 84 of the eyepoint features 54a and 54c with respect to the origin 126 of the wire bonding system 110. Furthermore, the processor 120 equates the average position of the two eyepoint features 54a and 54c with respect to the origin 126 with the average of the computed positions of the eyepoint features 54a and 54c. The processor 120 then equates the orientation of the eyepoint features 54a, 54c with the orientation of a vector that points from the sharp point 84 of the eyepoint feature 54c to the sharp point 84 of the eyepoint feature 54a. The processor 120 then computes the second plurality of positions using the computed orientation of the eyepoint features 54a, 54c, the computed average position of the eyepoint features 54a, 54c with respect to the origin 126, and the positions of the second bonding pads 102 with respect to the average position of the eyepoint features 54a, 54c stored in the memory during the initialization stage 202.

However, in another embodiment, it will be appreciated that the processor 120 could be adapted to identify the eyepoint features 54, 90 in a different configuration. For example, the processor 120 could be adapted to identify the single eyepoint feature 90. In particular, the average position of the eyepoint feature 90 could be equated with the position of the sharp point 96 of the eyepoint feature 90 with respect to the origin 126 of the wire bonding system 110. Furthermore, the orientation of the eyepoint feature 90 could be equated with the orientation of the first edge 92 of the eyepoint feature.

As shown in FIG. 6, the processor, in a request state 210, then requests the wire bonding device 132 to form the connecting wires 100 between the first and second bonding pads 36, 102. In particular, the processor 120 directs the wire bonding device 132 to install each of the connecting wires 100 in a sequential manner. Furthermore, the processor 120 instructs the wire bonding device 132 to install the connecting wires 100 between the first plurality of positions stored in the memory 122 and the second plurality of positions stored in the memory 122 during the processing stage 208.

As shown in FIG. 6, the processor, in a state 212, then requests the delivery device 138 to remove the wire bonded lead frame 42 from the support table 112. The delivery device 138 then removes the wire bonded lead frame 42 from the support table 112 and delivers the wire bonded lead frame 42 to the subsequent processing station 148. Furthermore, the processor 120 reenters the request state 204 so as to repeat the foregoing wire bonding process on a subsequent lead frame.

Thus, it will be appreciated that the wire bonding system 110 of FIG. 5 provides many advantages over prior art wire bonding systems. In particular, instead of identifying the relatively small substantially similar first ends 56 of the lead fingers 44 to determine the positions of the second bonding pads 102 of the lead frame 42 with respect to the origin 126 as is typically done in prior art wire bonding systems, the wire bonding system 110 instead utilizes the eyepoints features 54, 90 extending from the die paddle 50 to determine the positions of the second bonding pads 102. Since the eyepoint features 54, 90 are relatively large, space relatively far apart, and asymmetrically formed, the wire bonding system 110 is able to reliably identify the eyepoint features 54, 90 and, thus, determine the positions of the second plurality of bonding pads 102 with respect to the origin 126 of the wire bonding system 110 with a higher degree of confidence.

As discussed above, the relative position of the second bonding pads 102 on the lead fingers to the eyepoint features 54, 90 is previously provided to the wire bonding system. Hence, once the exact location of the eyepoint features 54, 90 for a particular lead frame 42 is determined by the wire bonding system, the positions of the second bonding pads 102 on each of the lead fingers can then be determined. Consequently, the wire bonding system 110 is able to install the connecting wires 100 between the first and second plurality of bonding pads 36, 102 with a greater likelihood of success.

Although the preferred embodiment of the present invention has shown, described and pointed out the fundamental novel features of the invention as applied to this embodiment, it will be understood that various omissions, substitutions and changes in the form of the detail of the device illustrated may be made by those skilled in the art without departing from the spirit of the present invention. Consequently, the scope of the invention should not be limited to the foregoing description, but should be defined by the appending claims.

What is claimed is:

1. A method of electrically connecting a first plurality of bonding pads of a semiconductor die to a second plurality of bonding pads located on lead fingers of a lead frame of a semiconductor device, the method comprising:

storing data indicative of (i) the shape and location of at least one eyepoint features of a lead paddle of an exemplary lead frame adapted to receive a semiconductor die (ii) the relative location between the at least one eyepoint feature of the lead paddle and the first plurality of bonding pads of a semiconductor die positioned on the exemplary lead frame and (iii) the relative location of a second plurality of bonding pads from the at least one eyepoint feature;

obtaining an image of a second lead frame corresponding to the exemplary lead frame;

identifying the location of at least one eyepoint feature formed on a die paddle of the second lead frame adapted to receive the semiconductor die wherein the location of at least one eyepoint feature is determined through pattern recognition of the obtained image of the second lead frame to recognize an edge of the at least one eyepoint image and then matching the recognized edge of the at least one eyepoint image to the corresponding edge of the eyepoint image of the exemplary lead frame to determine the position of the at least one eyepoint feature;

determining the relative locations of the first and second plurality of bonding pads from the position of the eyepoint feature located on the die paddle of the lead frame by using the stored data indicative of the relative positions between the eyepoint feature of the lead paddle and the first plurality of bonding pads and the second plurality of bonding pads from the exemplary lead frame; and;

directing a wire bonding device to form wire bonds between the first and second pluralities of bonding pads using the determined relative locations of the second plurality of bonding pads.

2. The method of claim 1, further comprising first determining the positions of the second plurality of bonding pads with respect to the eyepoint features.

3. The method of claim 2, wherein obtaining an image of the lead frame comprises:

requesting a digitized image from a digital imaging device;

retrieving the digitized image from the imaging device; and storing the digitized image.

4. The method of claim 3, wherein identifying the location of the at least one eyepoint feature comprises identifying the location of a first and second eyepoint feature.

5. The method of claim 3, wherein identifying the location of the at least one eyepoint feature comprises:

using an edge detection algorithm to locate a plurality of edges of the at least one eyepoint feature within the stored digitized image, using the located edges to compute the positions of the at least one eyepoint feature with respect to an origin.

6. The method of claim 5, wherein determining the relative location of the second plurality of bonding pads from the identified location of the at least one eyepoint feature located on the die paddle of the lead frame comprises:

using the computed position of the at least one eyepoint feature to compute an average position of the at least one eyepoint feature with respect to the origin;

using at least one of the located edges of the at least one eyepoint features to compute an orientation of the at least one eyepoint feature with respect to the orientation of the image; and using the computed average position and orientation of the at least one eyepoint feature to compute the positions of the second plurality of bonding pads with respect to the origin.

7. The method of claim 6, wherein using the computed average position and orientation of the at least one eyepoint feature to compute the positions of the second plurality of bonding pads with respect to the origin comprises using the computed average position and orientation of the at least one eyepoint feature with respect to the origin in conjunction with the positions of the second plurality of bonding pads with respect to at least one eyepoint feature.

8. The method of claim 1, wherein directing a wire bonding device to form wire bonds between the first and second pluralities of bonding pads comprises:

disposing a first end of at least one wire adjacent a corresponding first bonding pad of the first plurality of bonding pads;

bonding the first end of the at least one wire to the corresponding first bonding pad;

disposing a second end of the at least one wire adjacent a corresponding second bonding pad of the second plurality of bonding pads; and bonding the second end of the at least on wire to the corresponding second bonding pad.

* * * * *